United States Patent [19]

Brower et al.

[11] 4,394,709
[45] Jul. 19, 1983

[54] DIE-STAMPED CIRCUIT BOARD ASSEMBLY HAVING RELIEF MEANS TO PREVENT TOTAL SWITCH DEFORMATION

[75] Inventors: Boyd G. Brower; John W. Shaffer, both of Williamsport, Pa.

[73] Assignee: GTE Products Corporation, Stamford, Conn.

[21] Appl. No.: 336,531

[22] Filed: Jan. 4, 1982

Related U.S. Application Data

[62] Division of Ser. No. 131,614, Mar. 19, 1980, Pat. No. 4,320,572.

[51] Int. Cl.³ .............................................. H05K 3/20
[52] U.S. Cl. ...................................... 361/401; 361/404; 29/832
[58] Field of Search ................ 361/401, 404; 431/359; 29/835, 845, 849; 156/261

[56] References Cited

U.S. PATENT DOCUMENTS

| | | | |
|---|---|---|---|
| 2,772,501 | 12/1956 | Malcolm | 156/261 X |
| 3,253,324 | 5/1966 | Frey et al. | 361/401 X |
| 3,543,397 | 12/1970 | Hoagland et al. | 361/401 X |
| 3,823,344 | 7/1974 | Havas | 431/359 X |
| 3,911,716 | 10/1975 | Weglin | 156/261 X |
| 4,017,728 | 4/1977 | Audese et al. | 431/359 X |
| 4,028,798 | 6/1977 | Bechard et al. | 29/849 X |
| 4,030,001 | 6/1977 | Medley et al. | 361/401 |
| 4,113,424 | 9/1978 | Armstrong et al. | 431/359 |

Primary Examiner—R. R. Kucia
Attorney, Agent, or Firm—Lawrence R. Fraley

[57] ABSTRACT

A photoflash device circuit board assembly including a dielectric substrate and at least one switching element and conductor die-stamped therein. To assure that the delicate switch is not severed by the die's cutting edge during die-stamping, a relief means (e.g., slot) is provided within the substrate so that a segment of the switch can be aligned therewith. As an alternative, it is taught to provide stepped portions within the die's cutting edge to align with preselected portions of the switch and thus prevent total severance thereof.

11 Claims, 10 Drawing Figures

DIE-STAMPED CIRCUIT BOARD ASSEMBLY HAVING RELIEF MEANS TO PREVENT TOTAL SWITCH DEFORMATION

This is a division of application Ser. No. 131,614, filed Mar. 19, 1980, now U.S. Pat. No. 4,320,572, issued Mar. 23, 1981 (Inventors: Boyd G. Brower et al).

DESCRIPTION

1. Technical Field

The invention relates to electrically-activated, disposable photoflash devices and particularly to the circuit board assemblies utilized therein.

2. Background

Photoflash devices of the variety mentioned above typically include a circuit board having an insulative substrate with preestablished circuit patterns or "runs" thereon. Electrically connected at designated locations to this circuitry are a plurality (e.g., eight or ten) of high voltage flashlamps. The circuit board, with flashlamps secured thereto, is located within a suitable, insulative housing having a light-transmitting cover (to permit the high intensity output from each flashlamp to pass therethrough) and at least one connector tab for attaching the device to a respective camera and electrically connecting the circuit board's circuitry to the power source (e.g., piezoelectric element) typically located therein. Activation of the power source by the camera's user, such as by depressing the camera's shutter release button, results in a firing pulse being provided the circuitry and ignition of one of the device's flashlamps. One type of device containing a pair of opposing linear arrays of flashlamps and a singular, common connector tab is referred to in the art as a "flash bar", while another type, which is capable of being inverted and thus possessing two opposing connector tabs, is referred to as a "flip-flash". The "flip-flash" devices were designed primarily to substantially eliminate the photographic phenomenon known as "red-eye", which occurs when light is reflected by the retinae of subjects' eyes onto the photographic film to indicate the eyes' pupils as being red. These latter devices substantially eliminate this possibility by spacing the illuminating flashlamp a specified distance from the camera's lens.

One example of the aforementioned "flash bar" photoflash device is described in U.S. Pat. No. 3,857,667 (J. J. Vetere et al). An example of an eight flashlamp arrayed "flip flash" is described in U.S. Pat. No. 4,113,424 (D. E. Armstrong et al), while examples of ten lamp versions of this product are described in U.S. Pat. Nos. 4,152,751 (R. E. Sindlinger et al) and 4,164,007 (E. G. Audesse et al). All of the above patents are assigned to the assignee of the instant invention.

As stated, the present invention is concerned with a circuit board assembly which eventually forms an integral part of the final photoflash product. One example of a known technique for making such components (e.g., those used in the aforedescribed "flash bar" device) has been to silk-screen a silver-containing material over a ceramic-coated steel board and thereafter oven-fire the assembly to fuse the silver particles to a continuous conductor. The steel board was originally blanked from a strip of said material, sprayed or dipped with the ceramic, and fired to produce a hardened coating thereon. Silk-screening and oven-firing followed. Another type of technique (e.g., for those components used in many "flip-flash" devices) also involved silk-screening of silver-containing material but instead on a styrene copolymer, thermoplastic substrate (or board). The silver-containing material, applied in paste form, was then subjected to either a radiation curing or hot air drying step. In both of the above examples, the cured silver-containing material served as the conductive circuit in the finished device. Yet another technique (as used in at least one embodiment of a "flip-flash" device) involved approximately the same procedures as used to manufacture circuit board assemblies in such products as television sets. This process required several steps, including photoresist coating a copper-clad sheet of phenolic or other suitable base material and thereafter chemically removing (i.e., etching) the undesired copper. This component was then thoroughly cleaned and coated with a protective film.

The aforementioned techniques and resulting products contain several disadvantages. Silk-screening, for example, requires utilization of pastes which in turn are comprised of discrete silver particles located therein and separated by a binder. Although these pastes are eventually subject to some form of heat treatment to hopefully fuse said particles, the finished circuitry understandably is limited in its conductivity (and thus possesses an inherently higher resistance) in comparison to conductors presented in a solid state. Silk-screened circuitry is also susceptible to containment of discontinuities as might result from dust or lint interference during the screening operation. The presence of a screened silver layer also poses a problem when the chosen method for securing the device's flashlamps to the circuitry is soldering. Occasionally, the silver layer has prevented proper wetting during this process. Still another inherent problem with silk-screening conductive circuitry is the ready opportunity for dimensional impreciseness due to the horizontal flow (beneath the screen) as the paste is forced through the screen's pattern. In addition, occasional smearing of the circuit run is practically unavoidable. The latter problems are particularly troublesome to devices employing high voltage flashlamps in that sparkover can then occur between the circuit's elements, resulting in either product failure or simultaneous flashing of two or more lamps. A final disadvantage of the above processes is the relatively high cost associated therewith. Techniques using photo-resist coating, development, and subsequent chemical removal are understandably costly in terms of both time and material. Silk-screening is also understandably costly, particularly as a result of using the precious metal silver and the relatively rapid wear of the screen materials typically used in this process.

The present invention overcomes the several, aforementioned disadvantages by providing a circuit board assembly wherein die-stamping is utilized to accurately define and position a conductive circuit on an insulative substrate without the need for photo-resists, chemical echtants, precious metals, etc. In addition to this, and of equal or greater significance, the present invention defines a circuit board assembly wherein the device's circuit runs (or paths) satisfactorily positioned and electrically connected to other elements which also constitute part of the device's circuitry. One primary example of such an element as utilized in today's more recent products is a radiation sensitive switch which is usually electrically connected in series with a respective flashlamp and adapted for receiving the radiant energy from the lamp upon ignition thereof. The switch will thus melt or shrink to define an open circuit almost instantaneously after flashlamp ignition and thereby permit reliable flashing of the subsequent lamps in the device's array in rapid succession. An example of a radiation sensitive switch is described in U.S. Pat. No. 4,017,728 (E. G. Audesse et al), which is also assigned to the assignee of the present invention. As described therein, these switches are each typically comprised of a thin strip of polymeric material attached to the circuit board across a respective aperture provided therein. A typical ten-lamp array will include eight switches of this variety in view of the obvious understanding that the last fired lamp on each end of the array has no need for such an element. It is understood that the relatively delicate nature of such elements as radiation sensitive switches does not readily permit electrical connection thereto by a technique as relatively severe and demanding as die-stamping. Die-stamping has been utilized in the production of printed circuit components for use in products other than photoflash devices but only because such components (and therefore products) did not require such delicate elements as radiation sensitive switches therein. Typically, these products consisted of only a base or substrate, a solid metal conductor (e.g., copper foil), and a bonding adhesive. See, e.g., U.S. Pat. Nos. 3,911,716 (W. Weglin) and 3,990,142 (W. Weglin). The invention as will be described in thus deemed all the more unique and significant in that it not only defines an assembly which assures positive electrical connection between the component's circuit runs and delicate switch elements but also provides for definition and securement of the circuit runs to the insulative substrate which forms an integral part of the final products.

There is described in U.S. Pat. No. 4,325,771 (filed concurrently with parent application Ser. No. 131,614, now U.S. Pat. No. 4,320,572) a photoflash device circuit board assembly and method of making same wherein die-stamping is utilized to secure a conductor within a dielectric substrate atop and in electrical contact with a switch member of the aforedescribed variety. Both conductor and parts of the switch are simultaneously die-stamped into the substrate in such a fashion so as to prohibit deformation or severance of the delicate switch. Control of certain parameters (e.g., material hardness and thickness) is critical to achieve these results. In another U.S. Patent (U.S. Pat. No. 4,345,895, also filed concurrently with parent application Ser. No. 131,614), there is described an alternative means to that of U.S. Pat. No. 4,325,771 for assuring conductor and switch securement and connection within a dielectric substrate without deforming or severing the delicate switch element. In U.S. Pat. No. 4,345,895, the substrate is recessed beneath the area of die impact to permit substrate flexure. Parameter control is important here also but somewhat less critical than in the procedure defined in U.S. Pat. No. 4,325,771. As will be understood from the following description, the present invention differs substantially from the techniques and components of the aforementioned applications by defining a circuit board assembly wherein some deformation or severance to the switch occurs but not to an extent that the operational capability thereof is adversely affected. By the term deformation is meant the occurrence of a substantial indentation to or compression of the original thickness of the switch. Illustrated examples are provided below. By the term severance is meant that the die-stamping procedure results in a cutting through of the total thickness of the switch by the die member. This may occur only at certain locations within the member or across the entire width thereof. Accordingly, the instant invention can be manufactured using die-stamping but without the critical attention to parameter criteria deemed essential above.

It is believed therefore that circuit board assemblies possessing the above capabilities will constitute significant advancements in the art.

DISCLOSURE OF THE INVENTION

It is, therefore, a primary object of the present invention to enhance the art of circuit board assemblies for use in electrically activated photoflash products.

In accordance with one aspect of the invention there is provided a circuit board assembly which comprises a dielectric substrate, at least one switching element having a portion thereof pressed within the substrate, and a conductive member also pressed within the substrate. At least part of the conductive member is positioned atop the pressed portion of the switching element and in electrical contact therewith. A relief means is provided in the dielectric substrate to permit a segment of the switch portion being pressed within the substrate to be positioned therein and/or aligned therewith such that the segment is not deformed or severed during the pressing.

BEST MODE FOR CARRYING OUT THE INVENTION

For a better understanding of the present invention together with other and further objects, advantages and capabilities thereof, reference is made to the following disclosure and appended claims in connection with the above described drawings.

Figure 1:
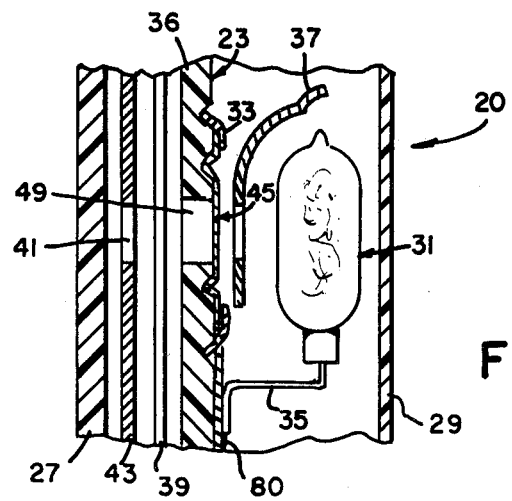
FIG. 1 is a partial elevational view, in section, of a photoflash device incorporating therein a circuit board assembly in accordance with a preferred embodiment of the invention.

With particular reference to FIG. 1, there is illustrated a partial elevational view of an electrically-activated photoflash device 20 incorporating a circuit board assembly 23 in accordance with the unique principles of the instant invention. Device 20, like many of the photoflash devices described above, includes a plastic housing with rear and forward members 27 and 29, respectively. These two members may be secured together, e.g., using cement, or it is also possible to produce the entire housing from a single member of such material. Forward member 29 is light-transmitting to permit light emitted from each of the several flashlamps 31 (only one shown) to pass therethrough upon lamp ignition. Ignition is achieved when the device's end connector tab or tabs (not shown) are inserted within the socket of the camera used therewith and the camera's shutter release button activated. A suitable firing pulse is produced by the camera's power source (e.g., piezoelectric element) and passed to the respective lamp 31 via the connection provided at the connector tab. This pulse travels up through the device's circuitry 33 which forms part of assembly 23. As shown in FIG. 1, the two conductive lead-in wires 35 (only one shown) of lamp 31 are connected to circuitry 33, said means of connection accomplished by such methods as soldering or crimping (e.g., using metal eyelets). The lead-in wires may also be frictionally retained within slots or grooves within the assembly's dielectric substrate 36. Photoflash devices of this type also typically include a reflector 37 for promoting forward light output. Reflector 37 is preferably of aluminum-coated plastic and located immediately behind lamp 31. Device 10 may further include a sheet of flash-indicating material 39 (e.g., biaxially oriented polypropylene) which shrinks or melts when subjected to heat from lamp 31 through a pair of aligned apertures with reflector 37 and the substrate component 36 to thereby change the color viewable through the openings 41 (one shown) provided in an indicia sheets 43 (also optional). A user of the device is thus provided with a ready means of ascertaining whether or not a particular lamp or group of lamps has been flashed. Understandably, rear member 27 of the device's housing is also light-transmitting to permit viewing in the manner defined. Sheet 43 may be of paper or thin cardboard.

As stated, photoflash devices containing the above components (excluding of course a circuit board assembly in accordance with the teachings of the invention) are known in the art with examples of such being described in detail, for example, in the aforementioned patents. As also stated, it is further known in the art to incorporate radiation sensitive switches as an important element of such devices. Reference is again directed to assignee's U.S. Pat. No. 4,017,728. These elements, represented generally as numeral 45 in FIG. 1, are also referred to in the art as radiant-energy-activated switches, quick-disconnect switches, etc., and typically comprise a length (strip) of electrically conductive, heat shrinkable polymeric material attached to the device's board member across a respective aperture 49 (see below). The switch being attached at its ends, the midportion thereof is thus spatially suspended to avoid physical contact with the heat-absorbing surfaces of the circuit board. This arrangement maximizes the speed with which shrinking and separation of the midportion occurs upon receipt of heat from adjacent lamp 31. As shown, lamp 31 and switch 45 are electrically connected in series to assure proper connection between the aforedescribed power source and remaining, unfired lamps which also form part of device 20. This mode of operation is fully described in the aforementioned U.S. Pat. No. 4,017,728 and further detail is not believed necessary.

Switch 45 comprises a thin strip of plastic preferably fabricated from a mono- or biaxially oriented polyethylene, polypropylene, polystyrene, polyester, or nylon. The polymeric material itself may be rendered conductive by additives such as carbons or it may be made surface conductive by deposition of a suitable conductive layer (e.g., aluminum) thereon. The performance by highly reflective materials, such as aluminized polypropylene, can be enhanced by applying a coating or spot (not shown) of dark, light-absorbing material (e.g., ink) on the surface of the switch which faces lamp 31.

As understood from the foregoing, it is essential that the opposing ends of switch 45 not only be properly secured to the board or substrate member 36 but also must be electrically connected to respective, designated portions of circuit 33. When using the aforementioned technique of silk-screening, this electrical connection was achieved by carrying the circuit pattern over the ends of the switch's step. This procedure thus resulted in additional use of the expensive, silver-containing conductive material, yet another disadvantage added to the several cited above. In some prior devices, switch 45 was secured to board 36 using an adhesive tape with pressure thereafter applied to hopefully provide securement. This procedure alone did not prove altogether satisfactory, however, in that the strip was occasionally removed from the board during subsequent processes to which this product was subjected.

In accordance with the teachings of the present invention, switching element 45 and the conductive members 33 which form part of the overall circuitry for the finished circuit board assembly 23 are securely positioned on the assembly's dielectric substrate 36 using a die-stamping process. As stated, this process differs from that defined in copending applications under Ser. Nos. 131,711 and 131,610 by permitting deformation or severance of parts of the switch 45 but not to an extent that this component is rendered inoperative. The unique result of this process is that the conductive members and switching element are positively secured within the substrate and also electrically connected. In addition, parameters such as material hardness and thickness, deemed critical in the above applications, do not require absolute compliance thereto.

Figure 2:
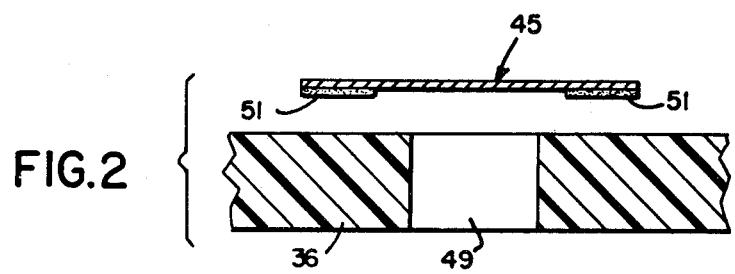
FIGS. 2 and 3 are partial elevational views, in section, of the preliminary steps of the method of making the invention.
Figure 3:
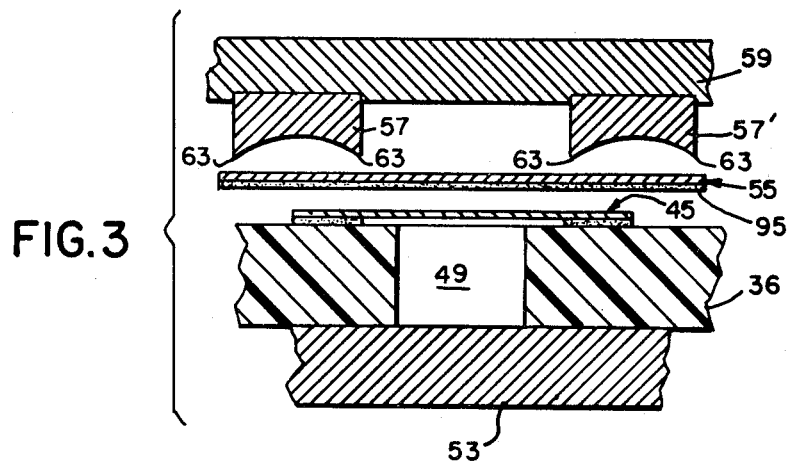

With particular reference to FIGS. 2 and 3, there are shown the initial steps in manufacturing the present invention. In FIG. 2, switching element 45, preferably comprised of the polyester Mylar having a conductive (aluminum) layer thereon, is positioned above substrate 36 so as to align with a cylindrical-shaped aperture 49 within the substrate. The aluminum conductive layer (not shown) is understandably located on the upper surface of the Mylar. Aperture 49 in the finished product (device 20) permits radiant energy from flashlamp 31 to pass therethrough to the aforedescribed indicia sheet 43. Aperture 49 also serves to assure that a major portion of element 45 will not physically contact the upper surface of substrate 36. Such a surface, being heat-absorbing, could serve to reduce the operational effectiveness of element 45 during exposure thereof to the intense energy from flashlamp 31. Accordingly, element 45 is located on substrate 36 so as to bridge aperture 49 (See also FIGS. 4 and 7). Initial attachment of element 45 is achieved by providing a quantity of adhesive 51 at both ends of the striplike element. Adhesive 51, preferably of the pressure-sensitive variety, may be applied using any of the techniques well known in the art. The element 45 and adhesive are located on substrate 36 and a suitable pressure (sufficient to activate adhesive 51 and form a bond between the substrate and element at these locations) is applied downwardly on the element's upper surface. A roller or similar member can be used as the pressure applicator.

Figure 5:
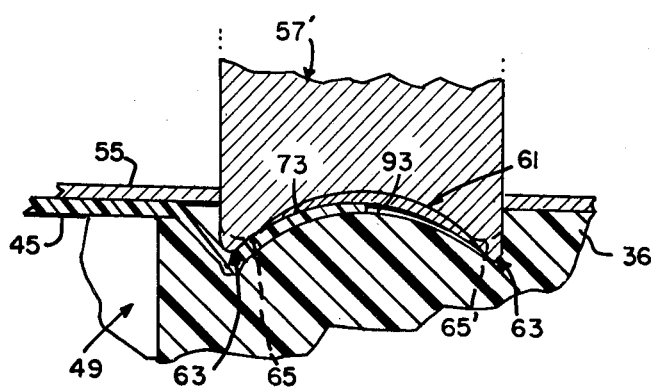
FIG. 5 is a partial elevational view, in section, showing the die of FIG. 4 at its full depth within the dielectric substrate of the invention.

In FIG. 3, the combined substrate and element members are shown as being positioned on a base or platen 53 which forms part of the larger die-stamping machine. Base 53 preferably includes a recessed portion or cavity (not shown) therein to better retain substrate 36, with the substrate being positioned within said cavity. A thin strip of conductive material 55 is then oriented above the substrate in the manner shown in FIG. 3, and is then lowered to substantially cover both substrate and switching element. Material 55 is dead soft aluminum, having a thickness of about 0.002 inch. Once in position, the aluminum strip is engaged by two dies 57 and 57' which each are secured or form part of an upper platen 59 of the machine. Platen 59 and dies 57 and 57' are preferably both comprised of steel (e.g., low carbon). The upper platen is lowered mechanically to effect said engagement with the positioned strip 55. Downward force is further applied by dies 57 and 57' until preselected portions 61 (FIGS. 5 and 6) of strip 55 and switching element 45 are pressed an established distance into the substrate (FIG. 5). A total force within the range of about 250 to 350 pounds per linear inch of cutting edge (of dies 57, 57') is applied using the materials and thicknesses described herein. The dielectric substrate, having a preferred thickness of about 0.043 inch, is embedded a depth of about 0.004 inch at its deepest location (immediately below the outer parallel cutting edges 63 of each die). Both end portions of the striplike switching element 45 are thus positively secured within substrate 36 on opposing sides of aperture 49. Element 45 possesses an original thickness of about 0.0005 inch to about 0.001 inch.

As stated, the selection of materials (having the proper ratios of thickness and hardness), die pressures, and die temperatures (if adhesives of the variety described herein are to be used) is not deemed as critical in the present invention in comparison to the teachings of Ser. Nos. 131,711 and 131,610 because the invention permits partial deformation and/or severance to preestablished sections of the switch during the die-stamping procedure, but does not permit total severance thereof. Understandably, complete (or total) severance of the switch (across the entire width thereof) at the location of deepest die penetration could easily result in the switch being inoperative. The present invention thus permits use of substrate materials possessing a greater hardness (including at the initial stages of die-stamping) than switch 45. For example, it is possible, using the teachings herein, to utilize the thermosetting resin phenolic for substrate 36. In addition to the above, significant advantages, it will be shown and described that the partial deformation of portions of switch 45 also serves to enhance switch securement to substrate 36 by permitting deeper penetration within the substrate by said deformed portions than is possible in the mentioned copending applications. This occurs, of course, in situations where the substrate's material is tolerant of such penetration, such as in the case where the polystyrenes are employed. Still further, the invention also provides for partial deformation of predetermined parts of the uncut sections of strip 55 to thus facilitate eventual removal of the unpressed portions of the strip.

Figure 4:
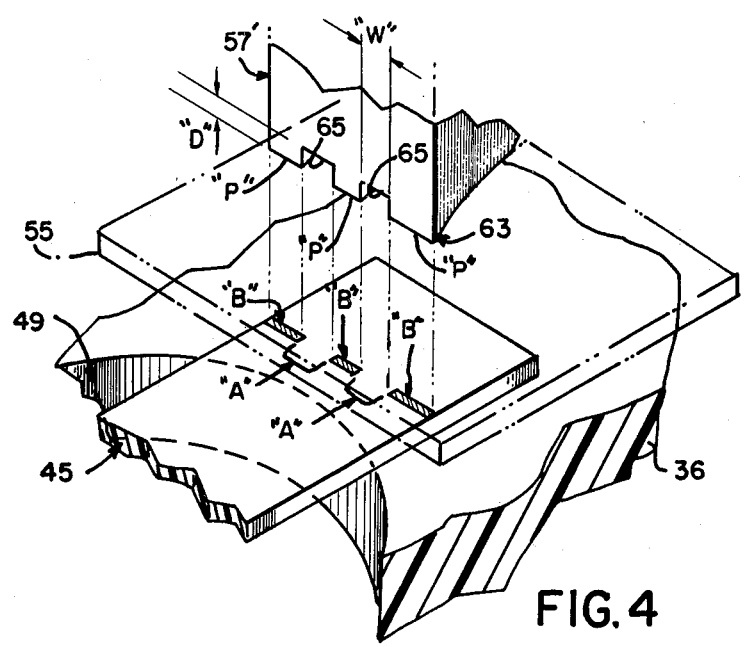
FIG. 4 is an enlarged, partial isometric view, partly in section, illustrating one of the preferred means of die-stamping a conductive member and part of a switching element within a dielectric substrate.
Figure 6:
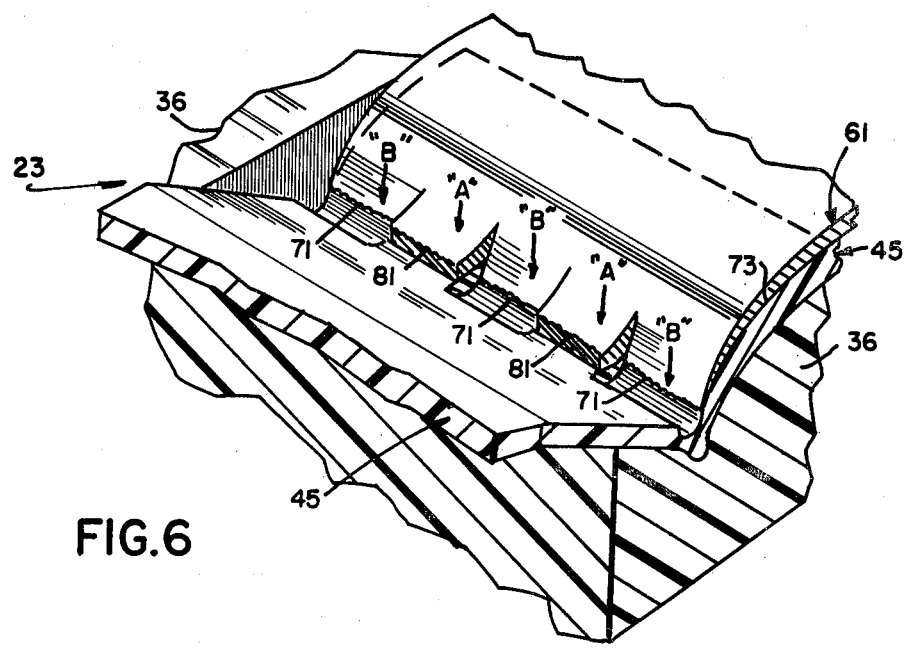
FIG. 6 represents an enlarged partial isometric view, partly in section, of the conductive member and switching element as die-stamped in accordance with the teachings of the method defined herein.

In FIGS. 4–6, there is illustrated the further steps of the method of making the invention wherein it is assured that complete severance of switch 45 at the location of die-stamping will not occur. More specifically, in FIG. 4 the parallel cutting edge 63 of die 57' is shown as including a pair of stepped (recessed) portions 65 therein which align with preselected areas "A" on the upper surface of the portion of switch 45 destined to be pressed within substrate 36. Accordingly, areas "A" will not be deformed or severed during pressing of switch 45 and the preselected portions 51 of aluminum strip 55 (shown in phantom in FIG. 4) within the substrate. Pressing is shown in FIG. 5 with the final configuration for assembly 23 depicted in FIG. 6. When a dinking depth of 0.004 inch is used and switch 45 has a thickness of about 0.001 inch, each step 65 has a depth ("D") of between 0.0005 inch and 0.0015 inch. Additionally, each step preferably has a width ("W") of about 0.017 inch to about 0.020 inch when cutting a switch having an overall width (at the location of engagement by edge 63) of about 0.055 inch. Using two steps 65 thus assures that from about 0.034 inch to about 0.040 inch of the total width of switch 45 will remain nondeformed or nonsevered. As will be shown below, the remaining parts of the switch (those below the areas immediately adjacent areas "A") will be either deformed or completely severed. For purposes of clarity, these latter areas are referred to by the letter "B" in FIGS. 4 and 6. It is preferred that only one of the parallel cutting edges 63 of each die be provided with a pair of steps 65. Preferably a total of two steps per edge is employed but this number can vary, provided the above percentages of nondeformed areas remain approximately the same. In one embodiment of the invention, only a single step 65 was used per edge, said step having an overall width "W" of about 0.034 inch to about 0.640 inch and depth "D" of about 0.001 inch.

The deformation of areas (or parts) "B" is better illustrated in FIG. 6. It can be clearly seen therein that the deeper penetrating portions "P" of edge 63 (FIG. 4) which align with areas "B" serve to deform the switch's upper surface at these locations and cause a permanent indentation therein. It is also shown that these parts of switch 45 more deeply penetrate substrate 36 than the remainder of the switch, thus enhancing securement of the switch within the substrate.

As stated, conductive member 61 is both positioned atop switch 45 and also in electrical contact therewith. Contact is formed primarily at two locations, the first being at the extreme, substantially flattened or tapered edges 71 of the conductive member defined by portion 61, and the second along the common arcuate surface (boundary) 73 between portion 61 and element 45. As shown, the conductive member is also of substantially arcuate configuration with ends 71 substantially tapered by the die-stamping procedure. This final configuration is due to the greater forces exerted along the outer, deeper penetrating parallel edges 63 of the die in comparison to forces exerted at its more recessed portions. It is shown that only part of conductive member 61 lies atop and physically engages the embedded portion of switch 45. This part is deemed of sufficient size, however, to achieve the contact required. The overlapping part also serves to assist in retention of the embedded portion of the switch. The use of parallel cutting edges 63 understandably permits some parts of strip 55 to remain attached to portion(s) 61 after stamping, if desired. These parts, e.g., 80 in FIG. 1, are also die-stamped within substrate 47 by the apparatus defined herein and will constitute the remaining section of circuit 33. Parts 80 are not shown in the remaining FIGURES of the drawings for clarification purposes. As to those sections of strip 55 which are not die-stamped within substrate 36, however, removal is necessary. In the case of the pressed conductive material constituting member 61, separation of the non-pressed remainder (not shown) of strip 55 understandably occurs along the edges 81 of those parts of the conductor located immediately above non-deformed areas "A" of switch 45. Removal was possible by manually lifting the non-pressed aluminum, causing it to tear along edges 81. This removal can be facilitated by adjusting the depth "D" of steps 65 such that those regions of the aluminum immediately above areas "A" are deformed or if desired, even completely severed, thus eliminating the need for the aforementioned tearing.

Figure 7:
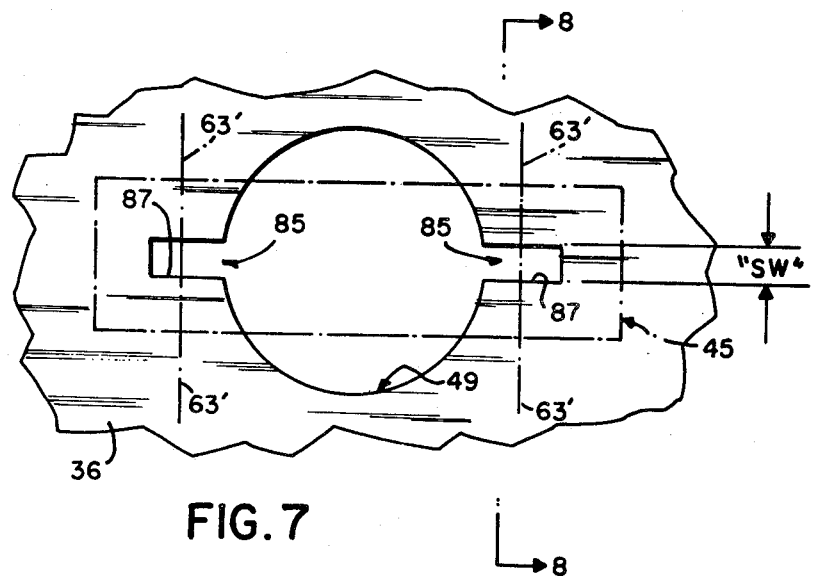
FIG. 7 illustrates a circuit board assembly wherein the assembly's dielectric substrate contains a pair of spaced relief means in accordance with a preferred embodiment of the invention.
Figure 8:
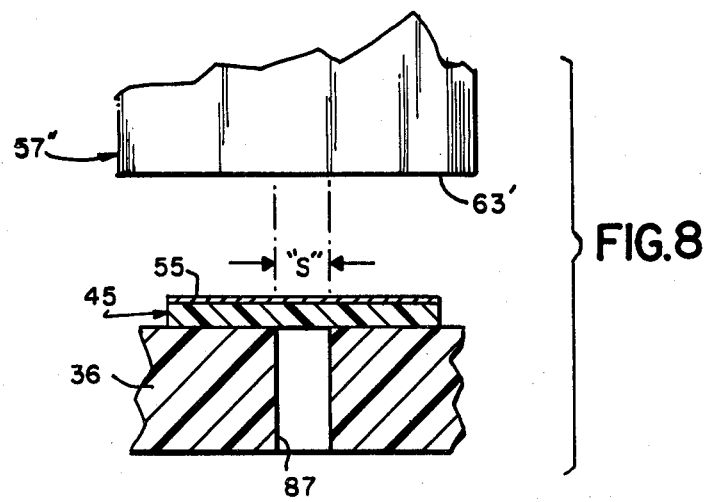
FIGS. 8 and 9 are partial elevational views showing the relative positions of the dielectric substrate, switching element, and conductor member before and after the die-stamping of the element and conductor within the substrate.

In FIGS. 7-10, there is shown an alternative method of making a circuit board assembly wherein total severance of the assembly's delicate switching element 45 is prevented. With particular reference to FIG. 7, relief means 85, each in the form of a slot 87, are provided within dielectric substrate 37 on opposite sides of aperture 49 and having access thereto. Each slot preferably extends through the entire thickness of substrate 36 to the bottom surface thereof. The Mylar switch 45 (shown in phantom in FIG. 7) is aligned over aperture 49 and slots 87 in the manner depicted in FIG. 7). Specifically, slots 87 are located under the end portions of the switch which are to be die-stamped within substrate 36 such that those segments (defined by dimension "S" in FIG. 8) of these end portions which are aligned with the respective slots cannot be severed by the cutting edge 63' of die 57" which effects the stamping. Edge 63', unlike edge 63 in the above embodiment, is planar and absent any steps or similar irregularities therein. The location of engagement with switch 45 by the parallel, planar cutting edges 63' are represented in FIG. 7 by the dashed lines 63'—63'. Clearly, these edges align with slots 87.

Figure 9:
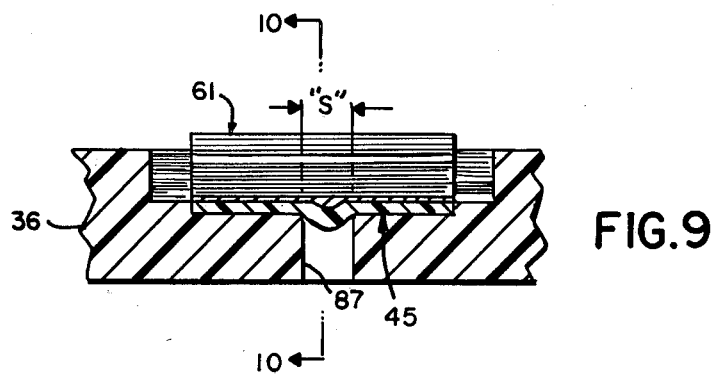
Figure 10:
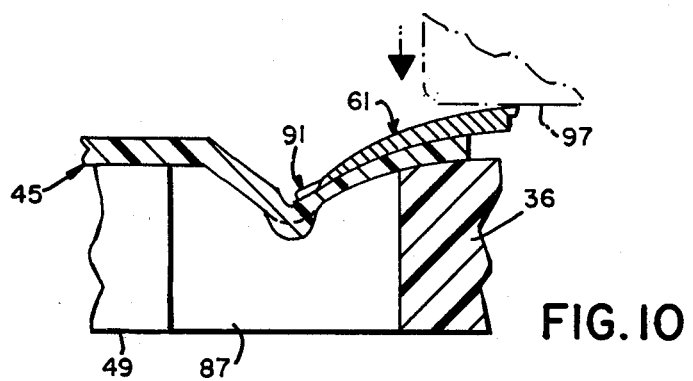
FIG. 10 is a partial elevational view, in section and as taken along the line 10—10 in FIG. 9, showing the final position of the pressed switching element and conductor within the invention's dielectric substrate.

When employing a switch 45 having an overall width of 0.055 inch, each slot 87 in turn possesses a width (dimension "SW") of only about 0.015 inch. Therefore, the non-aligned parts of switch 45 (those outside dimension "S") are either deformed or severed by edge 63'. As shown in FIGS. 9 and 10, deformation occurs in these locations and results in a reduction in thickness to switch 45 therein. The segment protected by slot 87 substantially retains its original thickness. As in the above, prior embodiment, those deformed portions of switch 45 become at least partially embedded withi substrate 36 (see FIG. 9) to thus enhance switch attachment thereto in a manner similar to that described above. It is also shown in FIG. 9 that at least a portion of the protected segment becomes positioned within slot 87 and remains so in the finished component. This feature even further enhances switch attachment over techniques such as described in Ser. Nos. 131,711 and 131,610.

With particular reference to FIG. 10, it can be seen that a part (91) of strip 55 which is also aligned with slot 87 during the die-stamping process is prevented from being completely severed by the die's cutting edge. Separation of the non-pressed aluminum strip is readily possible here also by simply tearing the strip along an edge of this part. It is also possible in this embodiment of the invention to facilitate such removal by adjusting the depth of slot 87 such that this part is deformed by the die's cutting edge. It is further within the scope of the invention to sever part 91 and eliminate the need for tearing altogether, for example, by using a harder switch material and softer substrate. With added regard to FIG. 10, the remaining, pressed portion 61 of the strip 55 assures the arcuate shape similar to that in FIG. 5. It is also fully understood that in the embodiment of FIGS. 7-10 that each pressed end portion of switch 45 will have a conductive member 61 located thereon (as in FIG. 5) and in electrical contact therewith. Thus, two opposed portions of switch 45 are secured within substrate 36 on opposite sides of aperture 49 to assure bridging thereof. And in each instance a segment of each portion is protected against severance by a relief means 85 provided within the substrate.

Much of the adhesive (51) which was originally applied to the bottoms of the ends of switch 45 pressed within substrate 47 will be forced out from under the switch during both of the above operations, but some (not shown) will remain to assist in retention. That adhesive material which is forced (or squeezed) out may settle within the recess 93 (FIG. 5) located under the non-covering portion of member 61. Thus, switch 45 provides a relief for this adhesive in the manner illustrated in FIG. 5.

As also shown in FIG. 3, another adhesive 95 can be applied to the bottom of aluminum strip 55. The preferred adhesive is of the heat sensitive variety (several of which are well known in the art) and preferably possesses a quick reaction time. It can be applied directly to the bottom of strip 55 during manufacture thereof or can be provided in separate, sheet form. Adhesive 95 has a thickness of about 0.0007 inch, and is activated during the die-stamping process by heating each of the top dies 57 and 57'. Preferred temperatures were within the range of about 325 to 400 degrees Farenheit. The bottom or base member 53 need not be heated. In the stamping operation, the adhesive engaging the common surface 73 will be substantially squeezed out into recess 93, thus further assuring the described positive contact along this surface. It was found, however, that even if adhesive was to remain at this location, adequate electrical contact was still attained. Subsequent to both of the aforedefined stamping procedures, the upper platen 59 is withdrawn (e.g., to the original elevation shown in FIG. 3) and the remaining, non-stamped part of aluminum strip 55 removed. Removal may be accomplished by hand, as described, or a suitable stripping tool (e.g., roller).

As an optional step, it may be desirable to engage predetermined (e.g., the uppermost) portions of the defined, stamped conductive member 61 with a heated die 97 (shown in phantom in FIG. 10) in the event that the heat sensitive adhesive location immediately under these portions was not fully exposed to the elevated temperatures of dies 57 and 57'. It is understood that this is but an optional step and may only be desired for portions of the circuit board assembly's circuitry which will be subjected to great stress (e.g., insertion forces encountered during positioning of the finished devices 20 within the socket of a respective camera). Die 77 would be heated to a temperature substantially the same for that of dies 57, 57', should this step be used.

Thus there has been shown and described a new and unique circuit board assembly for use in a photoflash device. In addition, there has been shown and described a new and unique method for making said assembly. It is understood from the foregoing description that the invention as described herein possesses all the significant advantages cited above.

While there have been shown and described what are at present considered the preferred embodiments of the invention, it will be obvious to those skilled in the art that various changes and modifications may be made therein without departing from the scope of the invention as defined by the appended claims.

What is claimed is:

1. A circuit board assembly for use within a photoflash device, said circuit board assembly comprising:
   a dielectric substrate;
   a thin, electrically conductive switching element positioned on said dielectric substrate and having a portion thereof die-stamped an established distance within a surface of said dielectric substrate;
   an electrically conductive member die-stamped within said surface of said dielectric substrate simultaneously with said switching element and having a part thereof located on said portion of said switching element die-stamped within said substrate, said die-stamping electrically connecting said conductive member to said portion of said switching element; and
   relief means located within said dielectric substrate for preventing total severing of said switching element during said die-stamping thereof within said dielectric substrate, at least one segment of said portion of said switching element die-stamped within said substrate being aligned with said relief means during said die-stamping and thereafter being positioned within said relief means such that said segment is not severed, at least one part of said die-stamped portion of said switching element adjacent said die-stamped segment of said portion being deformed or severed by said die-stamping.

2. The circuit board assembly according to claim 1 wherein said relief means comprises at least one slot located within said surface of said dielectric substrate.

3. The circuit board assembly according to claim 2 wherein said slot extends through the thickness of said dielectric substrate.

4. The circuit board assembly according to claim 2 wherein said dielectric substrate further includes at least one aperture therein, said switching element bridging said aperture, said slot located immediately adjacent said aperture and having access thereto.

5. The circuit board assembly according to claim 4 wherein said switching element includes a second portion thereof die-stamped within said dielectric substrate on an opposing side of said aperture from said first die-stamped portion, said assembly further including a second electrically conductive member die-stamped within said dielectric substrate simultaneously with said second portion of said switching element and having a part thereof located on said die-stamped second portion, said die-stamping electrically connecting said second electrically conductive member to said second portion of said switching element.

6. The circuit board assembly according to claim 5 including a second relief means located within said dielectric substrate on an opposing side of said aperture from said first relief means for preventing total severing of said second portion of said switching element during said die-stamping thereof, at least one segment of said second portion of said switching element being aligned with said relief means during said die-stamping of said second portion and thereafter being positioned within said relief means such that said segment is not severed, at least one part of said die-stamped second portion of said switching element adjacent said die-stamped segment of said second portion being deformed or severed by said die-stamping.

7. In the circuit board assembly according to claim 6 wherein said second relief means comprises at least one slot.

8. The circuit board assembly according to claim 7 wherein said slot extends through the thickness of said dielectric substrate.

9. The circuit board assembly according to claim 1 wherein the material of said dielectric substrate is selected from the group consisting of medium impact polystyrene, high impact polystyrene, and phenolic.

10. The circuit board assembly according to claim 9 wherein the material of said switching element is selected from the group consisting of mono- or biaxially oriented polyethylene, polypropylene, polystyrene, polyester, or nylon.

11. The circuit board assembly according to claim 10 wherein the material of said conductive member is dead soft aluminum.

* * * * *